United States Patent
Oribe et al.

(10) Patent No.: US 8,209,465 B2
(45) Date of Patent: Jun. 26, 2012

(54) DATA WRITING METHOD

(75) Inventors: Hiromichi Oribe, Aichi-ken (JP);
Masaki Takikawa, Aichi-ken (JP);
Yoshihiro Kitou, Aichi-ken (JP)

(73) Assignee: Hagiwara Sys-Com Co., Ltd., Aichi-ken (JP)

( * ) Notice: Subject to any disclaimer, the term of this patent is extended or adjusted under 35 U.S.C. 154(b) by 747 days.

(21) Appl. No.: 12/261,133

(22) Filed: Oct. 30, 2008

(65) Prior Publication Data
US 2009/0113119 A1    Apr. 30, 2009

(30) Foreign Application Priority Data

Oct. 30, 2007  (JP) ................... 2007-281471
Feb. 19, 2008  (JP) ................... 2008-037137

(51) Int. Cl.
*G06F 12/00* (2006.01)
(52) U.S. Cl. .......... 711/103; 711/E12.001; 711/E12.008
(58) Field of Classification Search .................. 711/103, 711/E12.001, E12.008
See application file for complete search history.

(56) References Cited

U.S. PATENT DOCUMENTS

| | | | |
|---|---|---|---|
| 2004/0186946 A1* | 9/2004 | Lee | 711/103 |
| 2005/0015557 A1* | 1/2005 | Wang et al. | 711/154 |
| 2007/0214309 A1* | 9/2007 | Matsuura et al. | 711/103 |
| 2008/0046608 A1* | 2/2008 | Lee et al. | 710/30 |
| 2009/0013233 A1* | 1/2009 | Radke | 714/752 |

FOREIGN PATENT DOCUMENTS

| | | |
|---|---|---|
| JP | 2000349853 | 12/2000 |
| JP | 2001273776 | 10/2001 |
| JP | 2006323739 | 11/2006 |

\* cited by examiner

*Primary Examiner* — Kevin Ellis
*Assistant Examiner* — Mehdi Namazi
(74) *Attorney, Agent, or Firm* — Lowe Hauptman Ham & Berner, LLP

(57) ABSTRACT

Data are write commanded from a host into a NAND flash memory. The data are saved once in a cache memory before being written into the NAND flash memory. The cache memory includes a physical segment whose size is the product of one page sector size of the NAND flash memory and the m-th power of 2 (m is 0 or a positive integer). A CPU records and manages the data writing status for each physical segment in a sector unit.

8 Claims, 20 Drawing Sheets

Fig.13

| Seg. | upper LBA | Gr. | LRU | Valid | Lock | Sector Map |
|---|---|---|---|---|---|---|
| 0 | 0AC0h | 0A | 0 | 1 | 0 | |
| 1 | | | | 0 | 0 | |
| 2 | | | | 0 | 0 | |
| 3 | | | | 0 | 0 | |
| 4 | | | | 0 | 0 | |
| 5 | | | | 0 | 0 | |
| : | | | | : | : | : |
| 14 | | | | 0 | 0 | |
| 15 | | | | 0 | 0 | |

Fig.14

| Seg. | upper LBA | Gr. | LRU | Valid | Lock | Sector Map |
|---|---|---|---|---|---|---|
| 0 | 0AC0h | 0A | 3 | 1 | 0 | |
| 1 | 0510h | 05 | 2 | 1 | 0 | |
| 2 | 13B0h | 13 | 1 | 1 | 0 | |
| 3 | 0080h | 00 | 0 | 1 | 0 | |
| 4 | | | | 0 | 0 | |
| 5 | | | | 0 | 0 | |
| : | | | | : | : | : |
| 14 | | | | 0 | 0 | |
| 15 | | | | 0 | 0 | |

Fig.15

| Seg. | upper LBA | Gr. | LRU | Valid | Lock | Sector Map |
|---|---|---|---|---|---|---|
| 0 | 0AC0h | 0A | 3 | 1 | 0 | |
| 1 | 0510h | 05 | 2→0 | 1 | 0 | |
| 2 | 13B0h | 13 | 1→2 | 1 | 0 | |
| 3 | 0080h | 00 | 0→1 | 1 | 0 | |
| 4 | 0520h | 05 | 2→0 | 1 | 0 | |
| 5 | | | | 0 | 0 | |
| ⋮ | | | | ⋮ | ⋮ | ⋮ |
| 14 | | | | 0 | 0 | |
| 15 | | | | 0 | 0 | |

Fig.16

| Seg. | upper LBA | Gr. | LRU | Valid | Lock | Sector Map |
|---|---|---|---|---|---|---|
| 0 | 0AC0h | 0A | 3 | 1 | 0 | |
| 1 | 0510h | 05 | 6 | 1 | 0 | |
| 2 | 13B0h | 13 | 8 | 1 | 0 | |
| 3 | 0080h | 00 | 7 | 1 | 0 | |
| 4 | 0520h | 05 | 6 | 1 | 0 | |
| 5 | 1380h | 13 | 8 | 1 | 0 | |
| : | : | : | : | : | : | : |
| 14 | 23E0h | 23 | 1 | 1 | 0 | |
| 15 | 0C50h | 0C | 0 | 1 | 0 | |

Fig.17

| Seg. | upper LBA | Gr. | LRU | Queue | Valid | Lock | Sector Map |
|---|---|---|---|---|---|---|---|
| 0 | 0AC0h | 0A | 3 | | 1 | 0 | |
| 1 | 0510h | 05 | 6 | | 1 | 0 | |
| 2 | 13B0h | 13 | 8 | → 0 | 1 | 0→1 | |
| 3 | 0080h | 00 | 7 | | 1 | 0 | |
| 4 | 0520h | 05 | 6 | | 1 | 0 | |
| 5 | 1380h | 13 | 8 | → 0 | 1 | 0→1 | |
| : | : | : | : | : | : | : | : |
| 14 | 23E0h | 23 | 1 | | 1 | 0 | |
| 15 | 0C50h | 0C | 0 | | 1 | 0 | |

Fig.18

| Seg. | upper LBA | Gr. | LRU | Queue | Valid | Lock | Sector Map |
|---|---|---|---|---|---|---|---|
| 0 | 0AC0h | 0A | 3 |  | 1 | 0 |  |
| 1 | 0510h | 05 | 6 |  | 1 | 0 |  |
| 2 | 13B0h | 13 |  | 0 | 1 | 1 |  |
| 3 | 0080h | 00 | 7 |  | 1 | 0 |  |
| 4 | 0520h | 05 | 6 |  | 1 | 0 |  |
| 5 | 1380h | 13 |  | 0 | 1 | 1 |  |
| : | : | : | : |  | : | : | : |
| 14 | 23E0h | 23 | 1 |  | 1 | 0 |  |
| 15 | 0C50h | 0C | 0 |  | 1 | 0 |  |

Fig.19

| Seg. | upper LBA | Gr. | LRU | Valid | Lock |
|------|-----------|-----|-----|-------|------|
| 0 | 0AC0h | 0A | 3→4 | 1 | 0 |
| 1 | 0510h | 05 | 6→7 | 1 | 0 |
| 2 | 13B0h →04D0h | 13 →04 | 0 | 0 →1 | 1 →0 |
| 3 | 0080h | 00 | 7→8 | 1 | 0 |
| 4 | 0520h | 05 | 6→7 | 1 | 0 |
| 5 | 1380h | 13 |  | 0 | 1 |
| ⋮ | ⋮ | ⋮ | ⋮ | ⋮ | ⋮ |
| 14 | 23E0h | 23 | 1→2 | 1 | 0 |
| 15 | 0C50h | 0C | 0→1 | 1 | 0 |

Sector Map

US 8,209,465 B2

DATA WRITING METHOD

RELATED APPLICATIONS

The present application is based on, and claims priority from, JP Application Number 2007-281471, filed Oct. 30, 2007, and JP Application Number 2008-037137, filed Feb. 19, 2008, the disclosures of which are hereby incorporated by reference herein in their entireties.

FIELD OF THE INVENTION

The present invention relates to a method of and apparatus for writing data to a NAND flash memory and more specifically to a method of and apparatus for writing data to a NAND flash memory by using a cache memory.

BACKGROUND ART

A prior art method of writing data to a flash memory is now described. A typical flash memory has a structure as shown in FIG. 1 and executes data writing (also called "programming") and reading in a unit referred to as a page and erases data in a unit referred to as a block. In the example illustrated in FIG. 1, the NAND flash memory is composed of 8192 blocks (physical blocks), each having 64 pages. Furthermore, each page has four sectors in total; each of the four sectors consists of 512 bytes of user data and 16 bytes of ECC (Error Check Code) and management information, i.e., 528 bytes in total, as one ECC sector (an ECC sector is referred to as a "sector" in the present document).

A physical block address of the NAND flash memory is managed in correlation with a logical block address. When a host makes the NAND flash memory execute a data writing and/or reading operation, the host specifies its object address to the NAND flash memory (this address specified by the host is generally referred to as a "host LBA"). At this time, a controller of the NAND flash memory recognizes the host LBA as a logical block address of the NAND flash memory and finds a physical block address of the NAND flash memory corresponding to that logical block address by making reference to a table (referred to as a "logical block—physical block conversion table" in the present document) representing a correlation between the logical block address and the physical block address. Then, the controller confirms, on the basis of the physical block address, the page and sector of the physical block the host specifies as a beginning point for data writing and/or reading data (see FIG. 2). The host notifies the controller of the amount of data to be written (how many sectors) together with the host LBA.

When a data write command is derived by the host, it is necessary to rewrite data in a block by combining data that are not to be re-written and the data to be re-written and derived by the host; the combined data are written into an empty block in the NAND flash memory. The write process in response to the host issuing a command to write twelve (12) sectors of data (the number of sectors to be written from the host LBA as the head address) as described subsequently in connection with the description of the drawings.

Assume now that the host LBA finds that the sector from which the data rewriting is to be performed is the second sector (S1) of the fourth page (P3) of the physical block address 1 (PB1) as shown in FIG. 3. Then the controller initially searches an empty block not correlated with the logical block address (referred to herein as a "write block"). The empty block, i.e., block EB 8 (FIG. 2) copies to the write block the data of pages P0, P1 and P2 of physical block PB1 that are not to be rewritten (see FIG. 4). Because, in this example, the rewriting must be done from data of sector S1 of page P3 of physical block PB1, the controller reads data of sector S0 from page P3 in physical block PB1 to a buffer so sector S0 is transferred to the buffer (see FIG. 5). Next, the controller copies once to the buffer the transferred data of sector S0 of the fourth page (P3) of the write block (EB 8). This copying of sector S0 to page P3 of write block EB8 is in accordance with a NAND flash memory protocol and so eleven sectors of the write data sent from the host are written from the portion of sector S1 into page P3 of write block EB 8 (see FIG. 6). Because the final data of the twelfth sector are data that could not be written independently to a sector S0 of the seventh page (P6) of EB 8, sector data from sectors S1 to S3 of page P6 of physical block PB1 are transferred once to the buffer (see FIG. 7). Then, the controller writes the data of the twelfth sector sent from the host to sector S0 in page P6 of the write block EB 8 and then transfers the data that has been transferred to the buffer from PB1, to sectors S1, S2 and S3 of the write block (see FIG. 8).

Then, the controller copies the data from page P7 to the final page of physical block PB1 to write block EB 8 (see FIG. 9). Then, the controller erases all of the data written in physical block PB 1, updates the logical block—physical block conversion table and ends the process of one data write command from the host.

The NAND flash memory executes the write process described above every time the host issues a write command for the NAND flash memory. Therefore, the write process is relatively slow. In addition, because the life of the NAND flash memory depends on the number of data writing and erasing operations, the life of a NAND flash memory is relatively short when it is frequently operated by the previously described conventional method.

BRIEF DESCRIPTION OF THE INVENTION

Accordingly, the invention solves the problem by providing a method of and apparatus for writing data to the NAND flash memory that is fast and capable of reducing a burden loaded on the NAND flash memory and a controller for controlling said NAND flash memory.

Another object is to optimize a duty cycle of data-transfer from a cache memory to a flash memory. Other object(s) will become obvious from the specification, drawings and specifically from the claims.

In order to solve the aforementioned objects, one aspect of the invention preferably provides a method of an apparatus for writing data to a NAND flash memory by once saving in a cache memory data write-commands derived by the host. As a result, it is possible to reduce the write time and to prolong the life of the NAND flash memory without putting an excessive burden on the NAND flash memory and on the controller for controlling the NAND flash memory by interposing the cache memory between the host and the NAND flash memory, by saving the data sent one after another from the host once in segments of the cache memory, and by writing the write-command data to the specified logical block together.

More specifically, the present invention preferably attains the aforementioned object by novel structural features. A preferable second feature of the invention is that the cache memory is composed of an aggregate of physical segments having a size equal to the product of one page sector size of the NAND flash memory and the m-th power of 2 (m is 0 or a positive integer), and a CPU records and manages, in a sector unit, the status of data written to each physical segment.

In addition to the second feature described above, a third feature of the method of the invention is that a CPU preferably executes a process including the steps of:

1) recording, in a virtual segment from its number "0", writing status of data which is initially write-commanded by the host after turning a system ON and written to the physical segment of the cache memory; and
   a) recording upper LBA and group LBA of the written data in a tag memory by correlating a physical segment number with a virtual segment number;
   b) recording, in the tag memory, that the written data to the physical segment are "valid", by correlating the physical segment number with the virtual segment number; and
   c) setting an LRU No. to the virtual segment and recording the set status in the tag memory;
2) when a data write command is issued in succession by the host, searching the tag memory; and
   a) when there is an existing virtual segment having the same upper LBA as that of the write-command data,
      a-1) overwriting the write-command data to the physical segment that is correlated with the existing virtual segment; and
      a-2) setting the existing virtual segment LRU No. to "0" and adding the number one (1) to the LRU No. set in the virtual segment(s), if any, whose LRU No. is smaller than the previous LRU No. of the existing virtual segment, and recording the updated LRU No(s). in the tag memory;
   b) when there is no virtual segment having the same upper LBA as that of the write-commanded data and there is an empty virtual segment,
      b-1) executing data writing to the empty physical segment; and
      b-2) when there is no virtual segment having the same group LBA, setting the virtual segment of the physical segment to which the new data are written LRU No. to "0;" and adding the number one (1) to the LRU No. of other whole existing virtual segment(s), if any, and recording the updated LRU No(s). in the tag memory;
      b-3) when there is a virtual segment having the same group LBA, setting the LRU No. of the virtual segment into which the new data-writing-status is recorded to a value of the existing virtual segment having the same group LBA, afterwards changing both LRU Nos. to "0", and adding the number one (1) to the LRU No. being set in virtual segment(s) having an LRU No. smaller than the previous LRU No. of the existing virtual segment and recording the updated LRU No(s). in the tag memory;
executing the abovementioned steps until data written to the physical segment reaches a predetermined address (threshold value).

After the system is turned ON, the CPU writes write-command data from the host sequentially to the physical segment of the cache memory. The size of the physical segment equals the product of the size of one page sector of the NAND flash memory and the m-th power of 2 (m is 0 or a positive integer). When the NAND flash memory having one page composed of four sectors is used, one physical segment can have any of the following sizes: four sectors, eight sectors, 16 sectors, 32 sectors, 64 sectors, 128 sectors and other powers of two. At the turn ON time, the CPU records the status of data written to the physical segment into virtual segment(s) being prepared in a sector map table within a cache manager in order to manage the status of the data written into the cache memory. The CPU records (i.e., stores) the data writing status of one physical segment in the corresponding virtual segment of a sector unit. The CPU manages the virtual segments by denoting the number of each virtual segment (virtual segment Number).

The write-command is performed by deriving indications of a host LBA and data length. The host LBA is indicated as "0AC3h" (h represents a hexadecimal notation).

Assume that one physical segment has a size equal to 16 sectors. Accordingly, in one virtual segment the data writing status is stored as 16 sector units (this is referred to as "16 sectors applicability" in this document). Accordingly, one virtual segment is divided into 16 parts and is managed by local addresses from its head (i.e., the sector having the lowest address). The head sector address is "0h" and the final sector address is "Fh". To the contrary, a possible value of a final digit of the host LBA can also be from "0h" to "fh". That is, both of head and final addresses of the host LBA can be the same. After data writing, the CPU records the data writing status from the sector address "3h" of the virtual segment. This recording is carried out by setting a flag (bit "1") in a pertinent address of the virtual segment.

The "upper LBA" is a logical address (virtual address) of the head sector of the virtual segment on the condition that the user recognizes the record starting position as the host LBA. When the virtual segment is 16 sectors in size, a possible values of the two least significant digits of the upper LBA are "00h", "10h", - - - , "F0h" (16 ways in total), so that the upper LBA is "0AC0h" in this case. The CPU writes the data writing status into the virtual segment and at the same time the CPU writes the "upper LBA" and the "group LBA" (described next) into the tag memory within the cache manager by correlating the physical numbers of the "upper LBA" and "group LBA" with virtual segment numbers for them.

The "group LBA" is determined by the number of sectors of one physical block of the flash memory. If, for example, one physical block is composed of 64 pages and one page is composed of four sectors, the number of sectors of one physical block is 256. This is also applicable to logical blocks, if the logical block corresponds to the physical block in a one-to-one relationship. Therefore, the two least significant digits (from "00h" to "FFh") of the host LBA can express all sector addresses of one logical block. Accordingly, values excluding the two least significant digits of the host LBA correspond to the logical block number of the flash memory. Accordingly, when the host LBA is 0AC3h, as described above, the "group LBA" becomes its two most significant digits, i.e., "0A".

If the virtual segment is composed of "32 sectors applicability", the virtual segment is divided into 32 parts so as to twice record the data writing status in the case of "16 sectors applicability". In the "16 sectors applicability" case, there are eight possible values of the two least significant digits, i.e. "00h", "20h", "40h", "60h", "80h", "A0h", "C0h" and "E0h".

In the case of "32 sectors applicability," if the host LBA is "0AD3h," the upper LBA in the tag memory is set to the virtual segment as "0AC0h" in the tag memory and the $20^{th}$ position ((F+3)h) from the head of the virtual segment corresponds to the host LBA and the $20^{th}$ position becomes the position where the recording of the data writing status is started.

The CPU also sets the LRU (Least Recently Used) No. "0" to the virtual segment number "0" and sets the data of the physical segment which is the basis of the recorded virtual segment being "valid (value="1")." At the same time, the CPU records the LRU No. "0" and the virtual segment value of "1" in the tag memory. The CPU sets the LRU No. so the CPU can handle all the virtual segments having a group "LBA" that are the same as each other, as a "same LRU group".

The LRU No. is set as a serial number that increases in turn by one (1), starting from "0," according to the recording order into the virtual segment. When there are plural virtual segments having the same group LBA, the same LRU No. is set for each of them. At the moment of data writing (data purge) to the NAND flash memory from the cache memory, the highest priority is given to a physical segment that corresponds to the virtual segment having the largest LRU No.

When a data write command is issued continuously from the host and there is an existing virtual segment whose upper LBA is the same as that of the write-commanded data, the CPU overwrites the data to the physical segment corresponding to the existing virtual segment and updates the physical segment corresponding to the virtual segment on the sector map table. The CPU also sets the LRU No. "0" to the existing virtual segment and adds the number one (1) to the LRU No. being set to the virtual segment(s), if any, whose LRU No. is smaller than the previous LRU No. of the existing virtual segment and records the updated LRU No(s). in the tag memory.

When there is no virtual segment having the same upper LBA and there is an empty virtual segment, the CPU writes the data to the empty physical segment.

Then if there are no existing virtual segments having the same group LBAs, the CPU sets the LRU No. "0" of a virtual segment of the physical segment to which the new data are written, and adds the number one (1) to the LRU No. of the other whole existing virtual segment(s), if any, and records the updated LRU No(s). in the tag memory.

If there are existing virtual segments having the same group LBAs, the CPU sets the LRU No. of the virtual segment in which the new data-writing-status is recorded to a value equal to the existing virtual segment having the same group LBA. Afterwards, the CPU changes both LRU Nos. to "0", and adds the number one (1) to the LRU No. being set in the virtual segment(s) having an LRU No. smaller than the previous LRU No. of the existing virtual segment and records the updated LRU No(s). in the tag memory.

The CPU executes the abovementioned steps until the data written to the physical segment reaches the predetermined address (threshold value) of the virtual segment. This threshold value can be set in the same way as all the virtual segment numbers or to the final virtual segment number.

Thereby, the LRU No. of a virtual segment (including another virtual segment having the same group LBA if it exists) indicates the status of data of the physical segment into which the data were written the longest time ago is the largest and the LRU No. of a virtual segment (including another virtual segment having the same group LBA if it exists) recording the status of data of the physical segment into which the newest data are written is the lower value. When the CPU writes data into the flash memory after that, the CPU uniquely determines its writing sequence by using this LRU No. Thus, data of the physical segment that is the basis of the recorded virtual segment whose LRU No. is larger than others has precedence concerning its data writing procedure to the flash memory.

When the data having the same upper LBA as that of an existing virtual segment are write-commanded by the host, the commanded data are overwritten into the virtual segment for which the value of the upper LBA is set. However, the final result of the history of the physical segment to which data have been overwritten is recorded in the sector map table until the data of the physical segment that is the basis of the recorded virtual segment is written into the flash memory. Thereby, when the data are transferred to the flash memory thereafter, the CPU can surely transfer the data of the physical segment that is the basis of the recorded virtual segment towards the flash memory on the basis of the information of the final result and information recorded in the tag memory. When the CPU transfers the data towards the flash memory, the CPU issues a command to the flash memory by using the information recorded in the sector memory and the information in the tag memory.

Furthermore, the data of all physical segments that are the basis of the recorded virtual segments having the same LRU No. are the same data that rewrite object blocks (logical block) of the flash memory, so that it is possible to (1) process a plurality of write-commands from the host together, (2) to reduce write time, and (3) prolong the flash memory life.

A fourth preferable feature of the method and apparatus of the invention is to adopt an arrangement wherein, the CPU operates the following process, when the data writing to the physical segment is executed to the predetermined address (threshold value), comprising steps of:

3-1) setting the virtual segment whose LRU No. is set to be the largest value to "Lock=1(queue state)" and recording the set LRU No. in the tag memory;

3-2) canceling the LRU No. of all virtual segments in which the largest LRU No. is set, and in compensation, setting a queue value to "0" anew and recording the set largest LRU No. in the tag memory;

3-3) transferring the data of the whole physical segment that is the basis of the recorded virtual segment whose queue value is set to "0" towards the flash memory; and 3-4) setting, at the time just before completing the transfer of the data towards the flash memory, a new queue value to "0" for the virtual segment having the largest LRU No. and repeatedly executing the transfer thereafter in the same manner.

When the data written to the cache memory reaches a predetermined number of physical segments (threshold value), data purge is executed from the physical segment to which the data were written, towards the flash memory.

In this case, the CPU sets each physical segment in which the LRU No. is set to the largest "queue state" (Lock=1) and records it in the tag memory. The Lock=1 queue state means that the data stored in the physical segment which is the basis of the recorded virtual segment is to be written into the flash memory. Accordingly, after the queue value is set, overwriting of data to the physical segment is prohibited on and until the queue state is canceled. At this time, the CPU (1) cancels the LRU No. set for the virtual segment having the largest LRU No., (2) replaces it, (3) sets a queue value "0" anew, and (4) records the newly set queue value in the tag memory. When the queue value is set, the CPU transfers the data in the whole physical segment that is the basis of the recorded virtual segment for which the queue value is set towards the flash memory. In this manner, it is possible for the CPU to write the next write-commanded data immediately to the empty physical segment. Also, by setting, at the time just before completing the transfer of the data towards the flash memory, a new queue value "0" for the virtual segment whose LRU No. is the largest and repeatedly executing it thereafter in the same manner, it is possible to optimize the data transfer duty cycle from the cache memory to the flash memory.

BRIEF DESCRIPTION OF THE DRAWINGS

FIG. 13 is a diagram of an example of the first state of the contents of the tag memory and sector map of FIG. 11.

FIG. 14 is a diagram of an example of the second state of the contents of the tag memory and the sector map of FIG. 11.

FIG. 15 is a diagram of an example of the third state of the contents of the tag memory and sector map.

FIG. 16 is a diagram of an example of the fourth state of the contents of the tag memory and sector map of FIG. 11.

FIG. 17 is a diagram of an example of the fifth state of the contents of the tag memory and sector map of FIG. 11.

FIG. 18 is a diagram of an example of the sixth state of the contents of the tag memory and sector map of FIG. 11.

FIG. 19 is a diagram of an example of the seventh state of the contents of the tag memory and the sector map of FIG. 11.

DETAILED DESCRIPTION OF THE DRAWINGS

Figure 1:
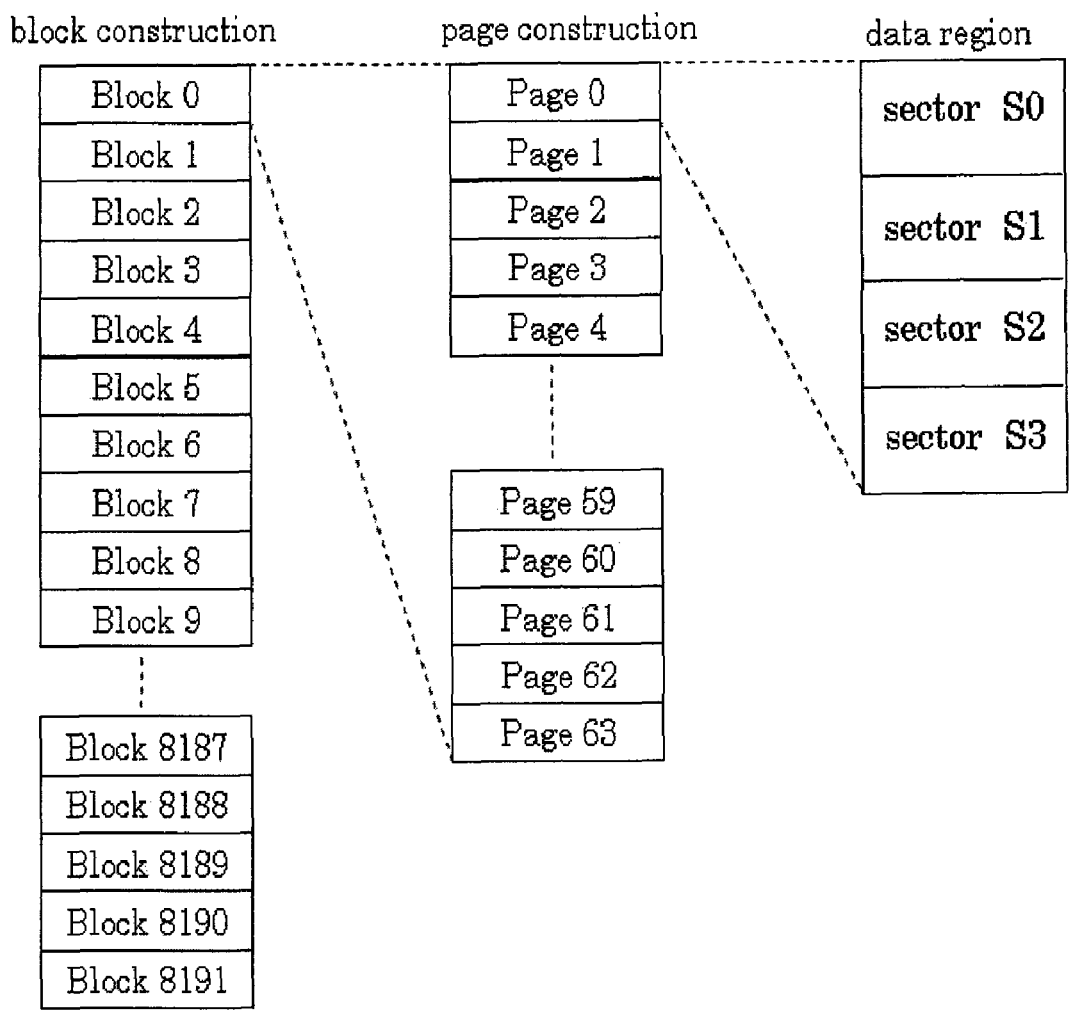
FIG. 1 is a diagram of an exemplary data structure of a NAND flash memory.
Figure 2:
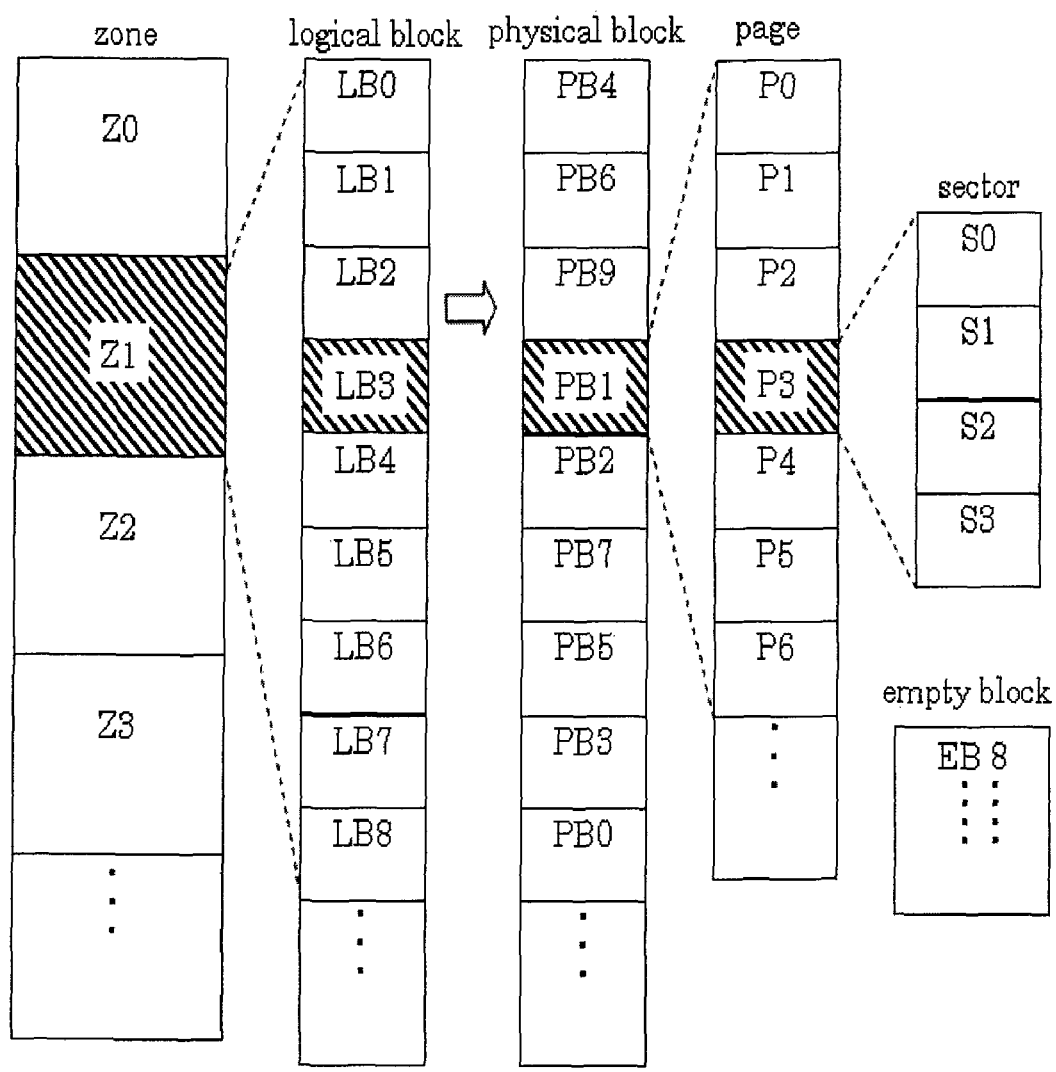
FIG. 2 is a diagram of an exemplary relationship between a prior art host LBA and a physical block.
Figure 3:
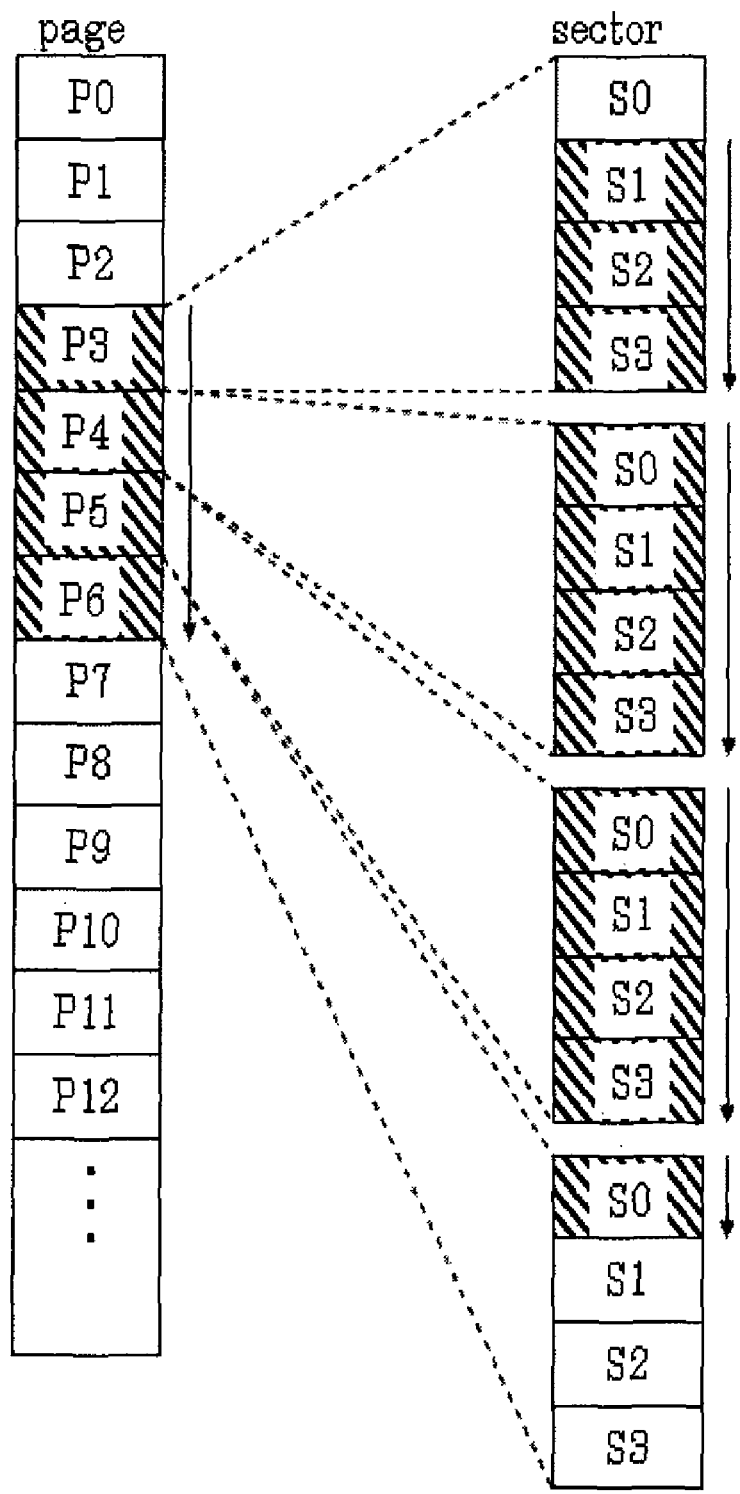
FIG. 3 is a conceptual diagram of data rewriting in a prior art NAND flash memory.
Figure 4:
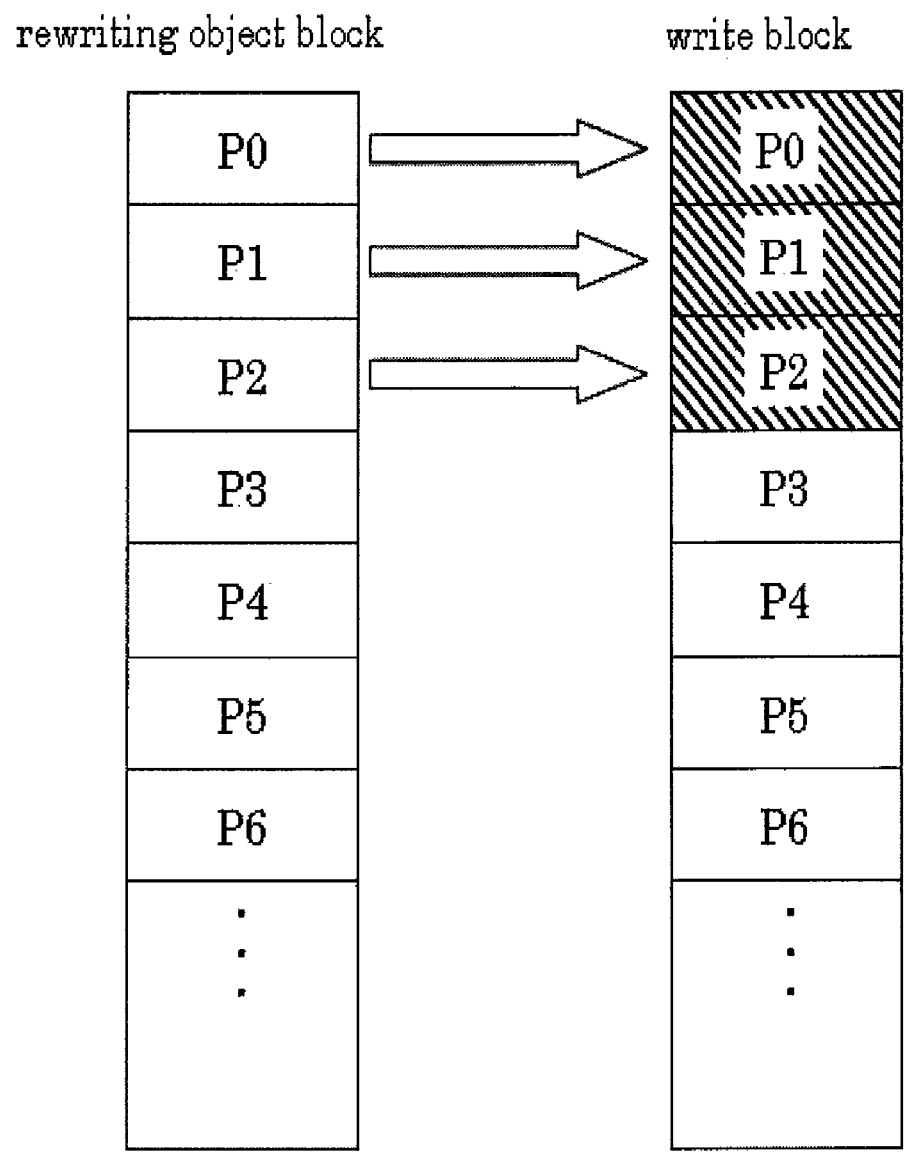
FIG. 4 is a diagram of a first prior art procedure for writing data to an empty block No. 1.
Figure 5:
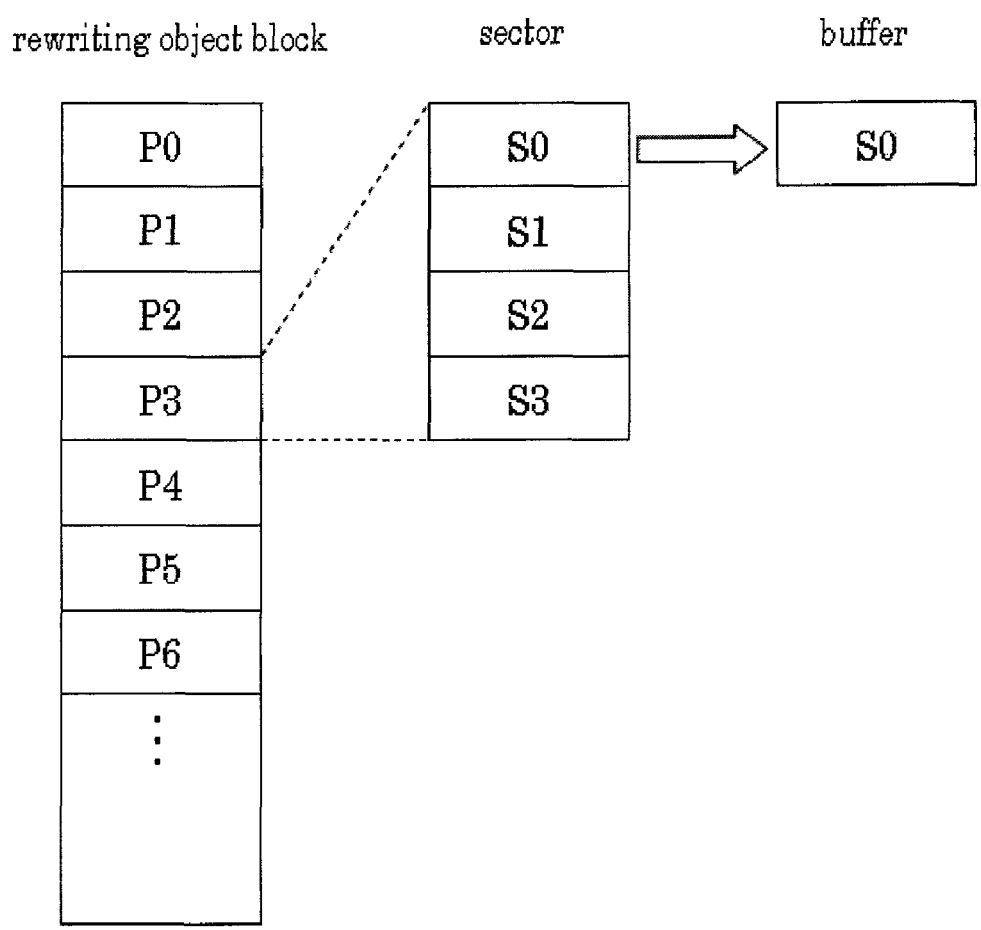
FIG. 5 is a diagram of a second prior art procedure for writing data to empty block.
Figure 6:
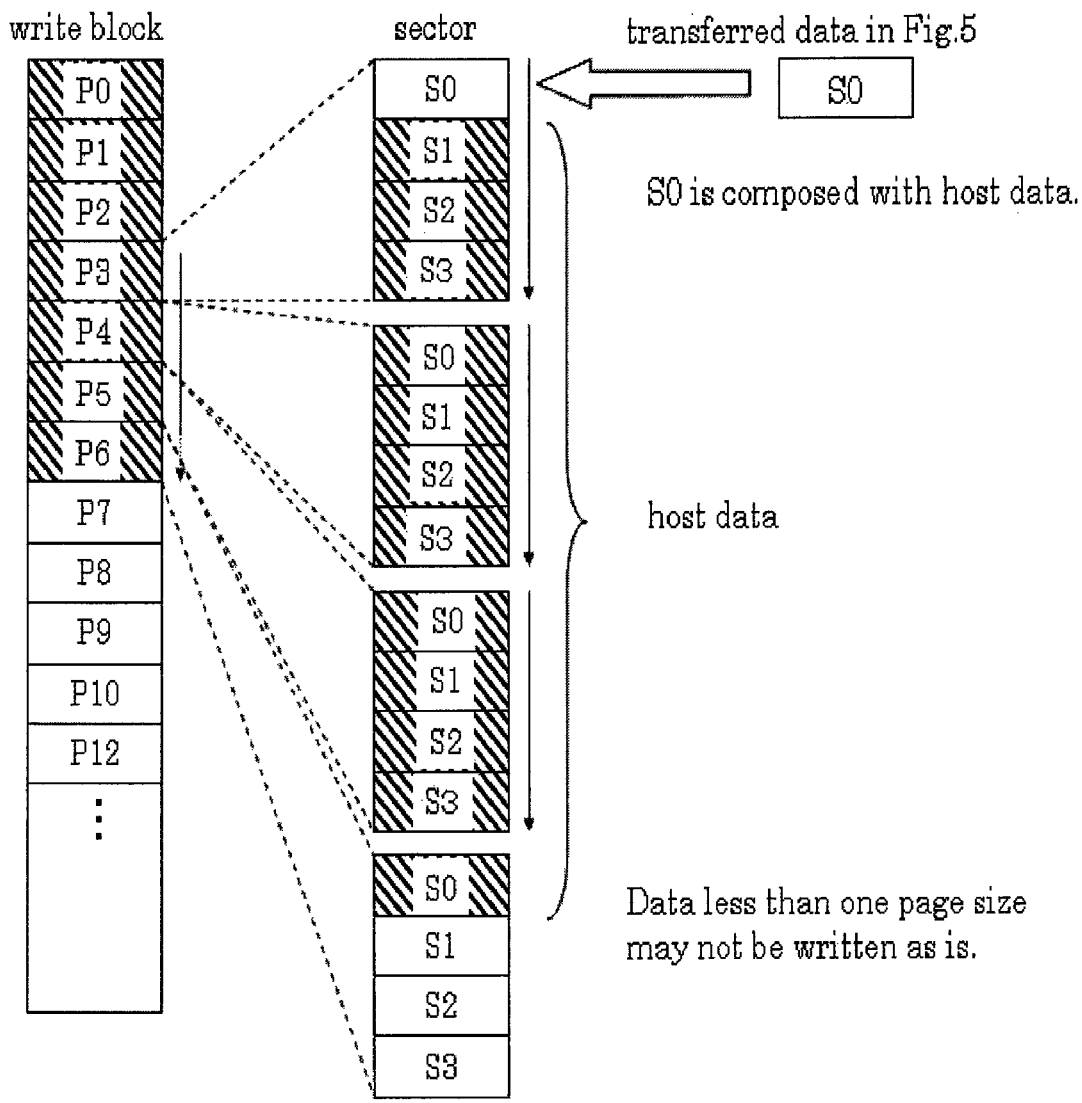
FIG. 6 is a diagram of a third prior art procedure for writing data to empty block.
Figure 7:
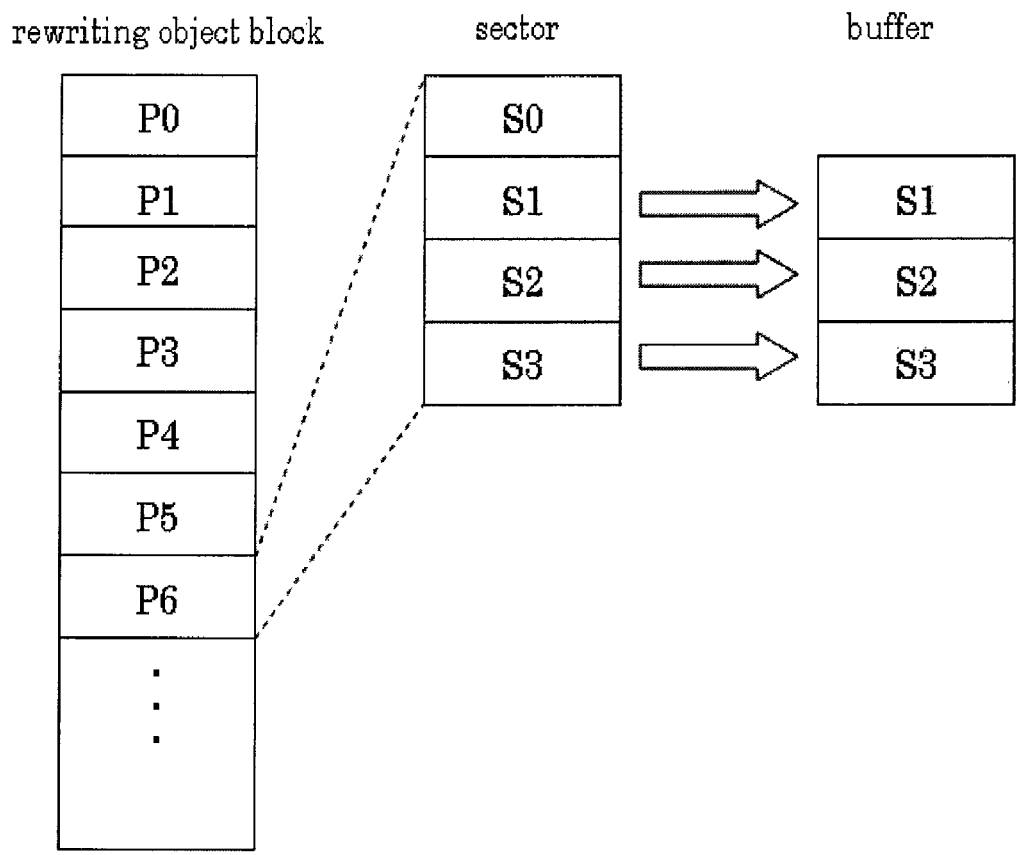
FIG. 7 is a diagram of a fourth prior art procedure for writing data to an empty block.
Figure 8:
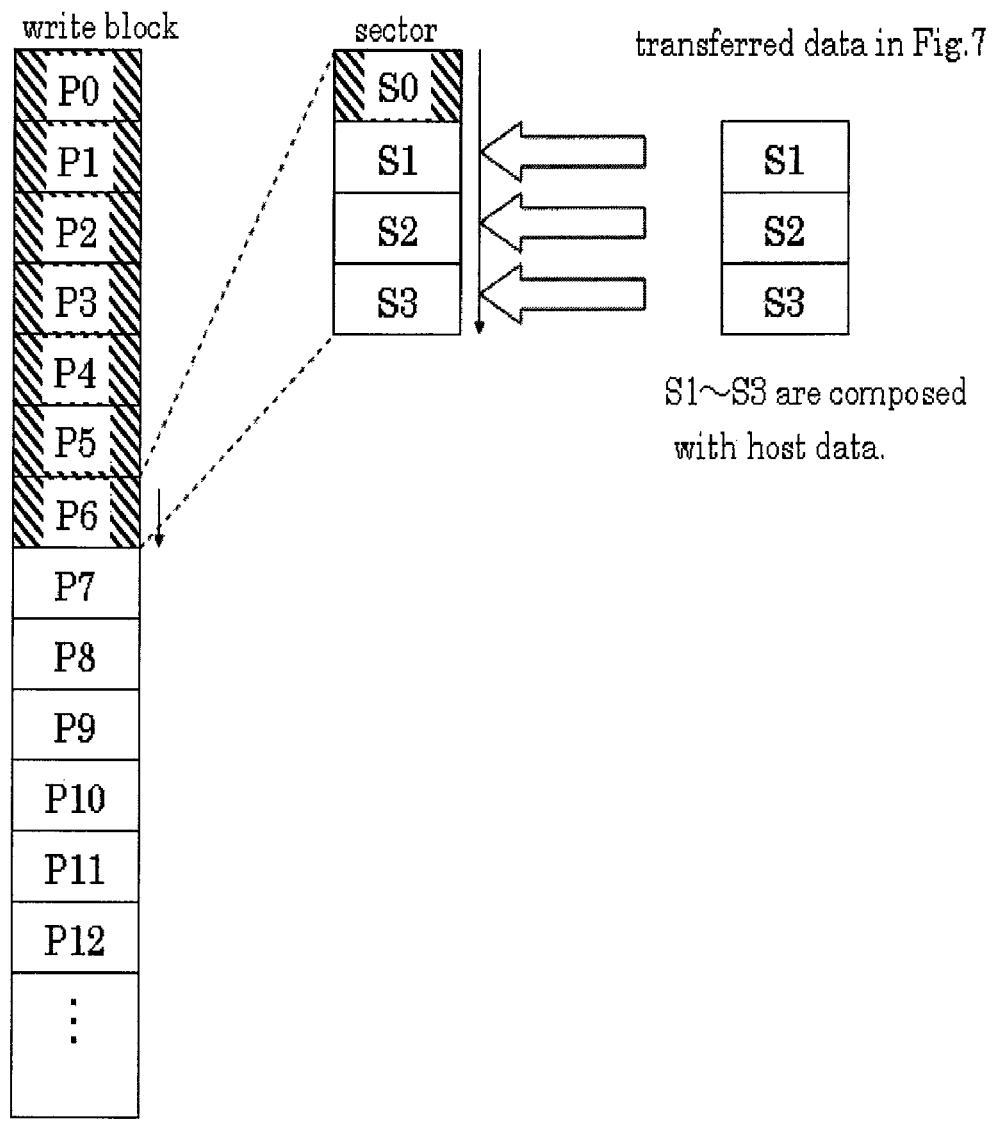
FIG. 8 is a diagram of a fifth prior art procedure for writing data to an empty block.
Figure 9:
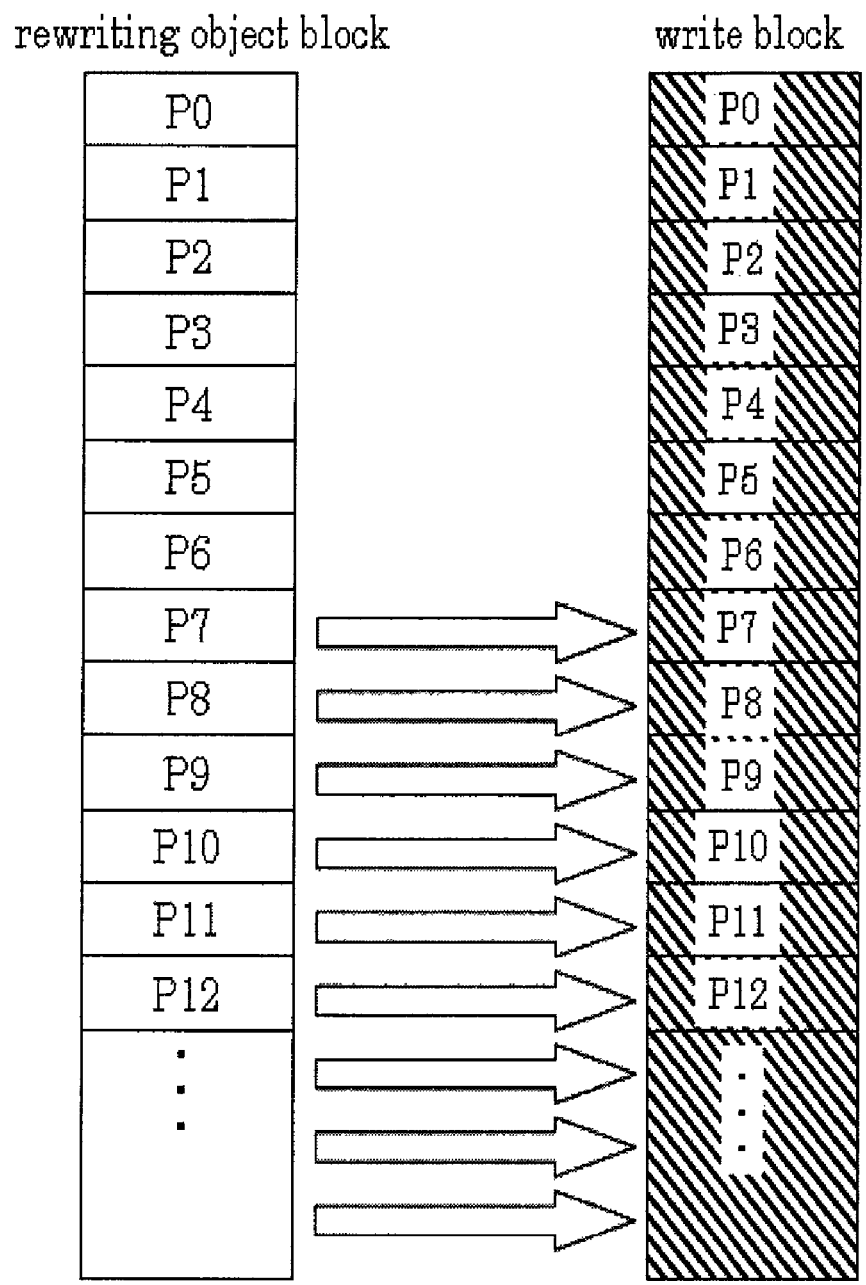
FIG. 9 is a diagram of a sixth prior art procedure for writing data to an empty block.

While the best mode for carrying the invention is described below with reference to the drawings, it is to be understood that the present invention can be carried out in various modes within Claims and is not limited to the embodiments described below.

Exemplary Structure of a Data Region of a NAND Flash Memory

Initially, an exemplary structure of a page of a flash memory is described with reference to FIG. 10 before a preferred embodiment of the invention is described. The flash memory has a type of Multi-Level Cell (MLC) Large Block, beside a Single-Level Cell (SLC) small Block and a Single-Level Cell (SLC) Large Block.

The SLC is characterized by its binary cell, while the MLC is characterized by its multi-value cell. In the SLC small Block, one page is composed of one sector, i.e., a data region having 512 bytes and a redundant region having 16 bytes (see FIG. 10A); one small block is composed of 16 pages or 32 pages. In the SLC Large Block, one page is composed of four sectors for example and one block is composed of 64 pages. In the MLC Large Block, one page includes four sectors (see FIG. 10B) and one large block includes either 64 pages or 128 pages. While the method is applicable to both the SLC memory and the MLC memory, the following description is (except as otherwise noted) based on an SLC large block in which one page is composed of four sectors and one block is composed of 64 pages.

Example of System Structure

A system for carrying out the method is described with reference to FIG. 11. The method can be carried out by a system including host 1 and Solid State Disk (SSD) 2 connected with the host 1 by an ATA interface for example. The SSD 2 is composed of NAND flash memories 21 (the NAND flash memory is referred to as a flash memory hereinafter), a cache memory 22 for temporarily saving data sent from the host 1 and a main controller 23 for controlling operations such as writing of data stored in the cache memory 22 to the NAND flash memory 21. When a read data command stored in the NAND flash memory 21 is derived by the host 1, the main controller 23 executes a control for sending the data to the host 1.

The cache memory 22 is composed of a Synchronous Dynamic Random Access Memory (SDRAM) for example. The NAND flash memory 21 and the main controller 23 are typically composed of either individual integrated circuits (ICs) or as one integrated circuit package. The SSD 2 can be a structure physically independent of the host 1 or can be carried by an integrated circuit substrate so as to be removable from the host 1 and to be readily replaced by a new host when the life of the NAND flash memory 21 ends. The cache memory 22 comprises an aggregate of segments (referred to as "physical segments" to distinguish them from "virtual segments" hereafter). In the use of the SLC large block having one page composed of four sectors and one block composed of 64 pages, i.e. 256 sectors in total, the size of one physical segment equals the product of (1) the size of a one page sector of the NAND flash memory 21 and (2) the m-th power of 2. This can be shown as follows:

One physical segment size of the cache memory=the size of one page sector size of the NAND flash memory$\times 2^m$ (m=0 or an integer less than 7 in this embodiment)
That is to say, the size of one physical segment is composed of 4 sectors (m=0), 8 sectors (m=1), 16 sectors (m=2), 32 sectors (m=3), 64 sectors (m=4), 128 sectors (m=5) or 256 sectors (m=6). In the embodiment described in this document, it is assumed that one physical segment is composed of 16 sectors (m=2). A CPU 237 manages each physical segment by using the address of each physical segment.

The main controller 23 includes the following components: (1) a NAND flash controller 235 for controlling operation of writing/reading data to/from the NAND flash memory 21 on the basis of a NAND protocol, (2) an ATA interface for controlling section 231 for controlling communications for taking write-commanded data from the host 1 within the SSD 2 on the basis of an ATA command, (3) a bus 232, (4) a SDRAM controller 234 for physically controlling the transfer of the data sent from the host 1 via the ATA interface controlling section 231 and the bus 232 to the cache memory 22, (5) the CPU 237, and (6) a cache manager 236 for managing (a) writing of data sent from the host 1 to the cache memory 22 and (b) sending the data in the cache memory 22 to the NAND flash memory 21 in response to commands from the CPU 237. CPU 237 totally manages each block described above within the main controller 23. The CPU 237 also has a program code that stores (1) a sector (not shown) and (2) computer programs (in firmware) for executing the method. CPU 237 also has a RAM portion that functions as a work area. The NAND flash controller 235 includes an error correcting circuit which (1) creates an error correcting code for writing data sent from the cache memory 22 to the NAND flash memory 21, and (2) writes the error correcting code to a redundant region of each sector of the NAND flash memory 21.

Figure 11:
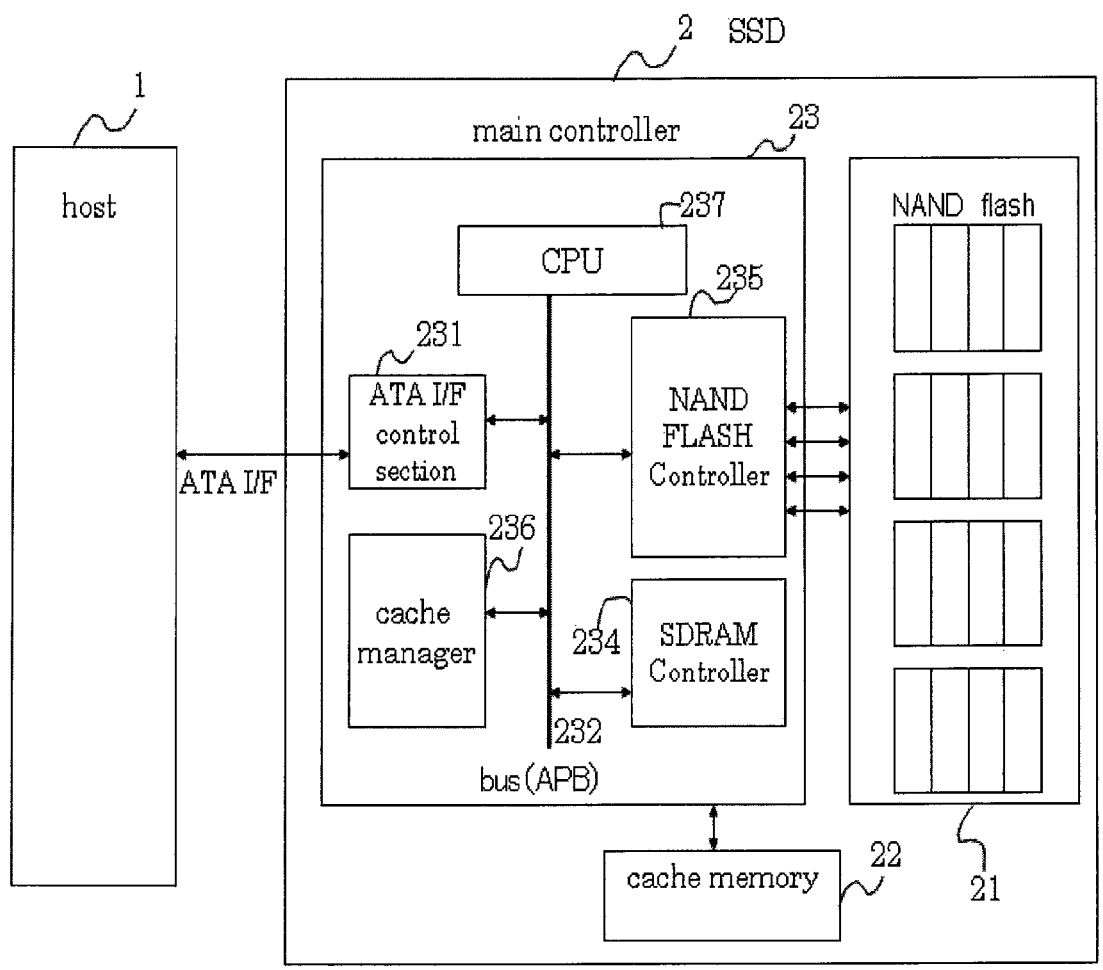
FIG. 11 is a block diagram of an example of a system in accordance with a preferred embodiment of the present invention.
Figure 12:
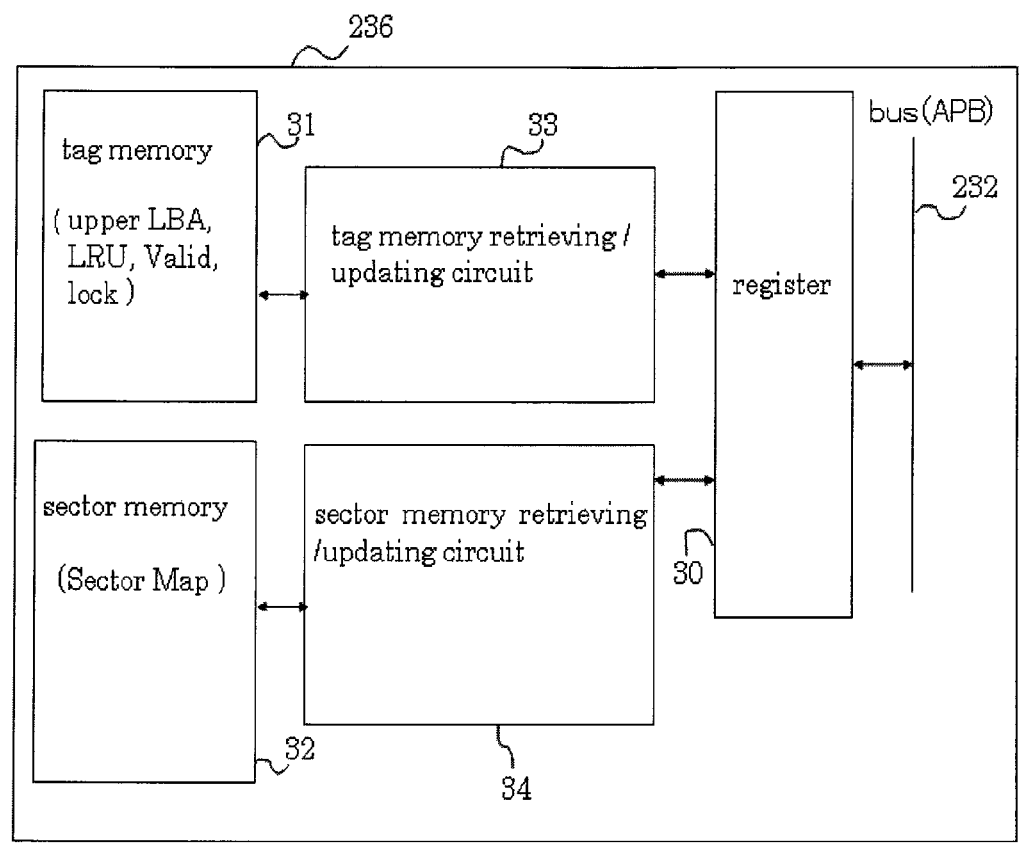
FIG. 12 is a block diagram of a hardware structure of the cache manager of FIG. 11.

FIG. 12 is a block diagram of hardware of the cache manager 236 of FIG. 11. The cache manager 236 has a tag memory 31, a sector memory 32, a tag memory retrieving/updating circuit 33, a sector memory retrieving/updating circuit 34 and a register 30 connected with the APB bus 232. The tag memory 31 stores recorded information such as upper LBA, group LBA, LRU Number, settings indicating written data are valid (valid=1) or invalid (Valid=0), settings indicating whether a queue is in a locked state (Queue state) (Lock=1) or not locked state (Lock=0), a queue value and the like. Details of memory 31 are described infra.

The tag memory retrieving/updating circuit 33 (1) writes the information described above into the tag memory 31, and (2) updates and retrieves the information set in the tag memory 31 in accordance with a command sent from the CPU 237 via the register 30. Circuit 33 is composed of hardware. Sector memory 32 includes a sector map table. The sector map table includes a sector map into which the CPU 237 records the status of written data of the physical segment, updates the status in real time and retrieves the state of the status after that. The sector map table is composed of an aggregate of multiple virtual segments denoted by serial numbers. Each virtual segment is an element into which the CPU 237 records the data writing status of the physical segment in unit of sector. The number denoted to the virtual segment is referred to in this document as a "virtual segment number."

Figure 20:
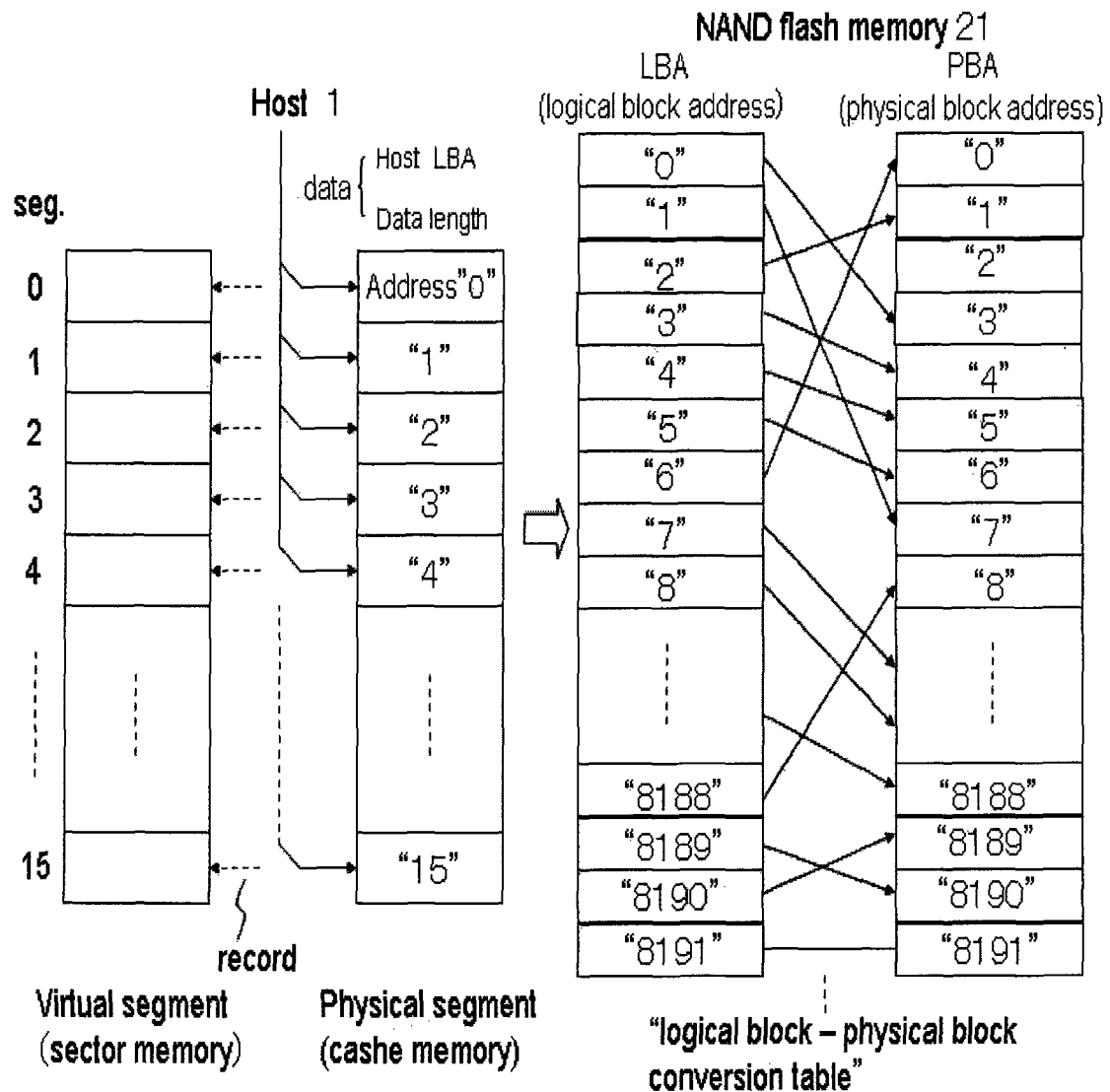
FIG. 20 is a diagram of data flow from a host to a NAND flash memory.

The sector memory retrieving/updating circuit 34 records the data writing status into the sector map table of sector memory 32, updates the status and subsequently retrieves the table in accordance with a command sent from the CPU 237 via the register 30. The sector memory retrieving/updating circuit 34 is also typically composed of hardware. As described hereafter, CPU 237 transfers the data of the physical segment to NAND flash memory 21 on the basis of the information in the sector map. The physical segment address and the virtual segment number are preferably handled by fixedly correlating them in a one-to-one relationship to each other (see FIG. 20). CPU 237 transfers the data from the physical segment to the NAND flash memory 21 on the basis of this correlation. The virtual segments are provided for all physical segments of data stored in the cache memory 22.

Explanation of Operations

FIG. 13 is a diagrammatic illustration of the contents recorded in tag memory 31 and in sector memory 32. The right side of FIG. 13 is a diagrammatic illustration of the sector map into which the state of data written to the physical segment is recorded; the left side of FIG. 13 is a diagrammatic illustration of information recorded in the tag memory 31. In FIG. 13, "Seg." represents the term the "virtual segment" and the numbers below "Seq." represent the virtual segment numbers. As shown in FIG. 13, the serial virtual segment numbers start from "0;" the first serial virtual segment number is referred to herein as the head number.

In this embodiment, the physical segment address and the virtual segment number are fixedly correlated in a one-to-one relationship to each other. As mentioned above, one physical segment is composed of 16 sectors (m=2); accordingly one virtual segment is divided into 16 parts in order to record the 16 sectors of data stored in the physical segment. This relationship is referred to in this document as "16 sectors applicability." In this embodiment as a matter of convenience, the sector map table is explained so as to being comprised of 16 virtual segments in total. In this point, it will be understandable that one virtual segment may be composed any of 32-sectors-applicability, 64-sectors-applicability, 128-sectors-applicability or 256-sectors-applicability by adapting to its correlating physical segment size.

A-1: First Data Writing

After turning the system ON, the CPU 237 sequentially writes the data which is firstly write-commanded from the host 1 to the physical segment starting from its address "0". Then, the data writing status in the physical segment address "0" is recorded into the virtual segment number "0" of the sector map table.

Figure 10:
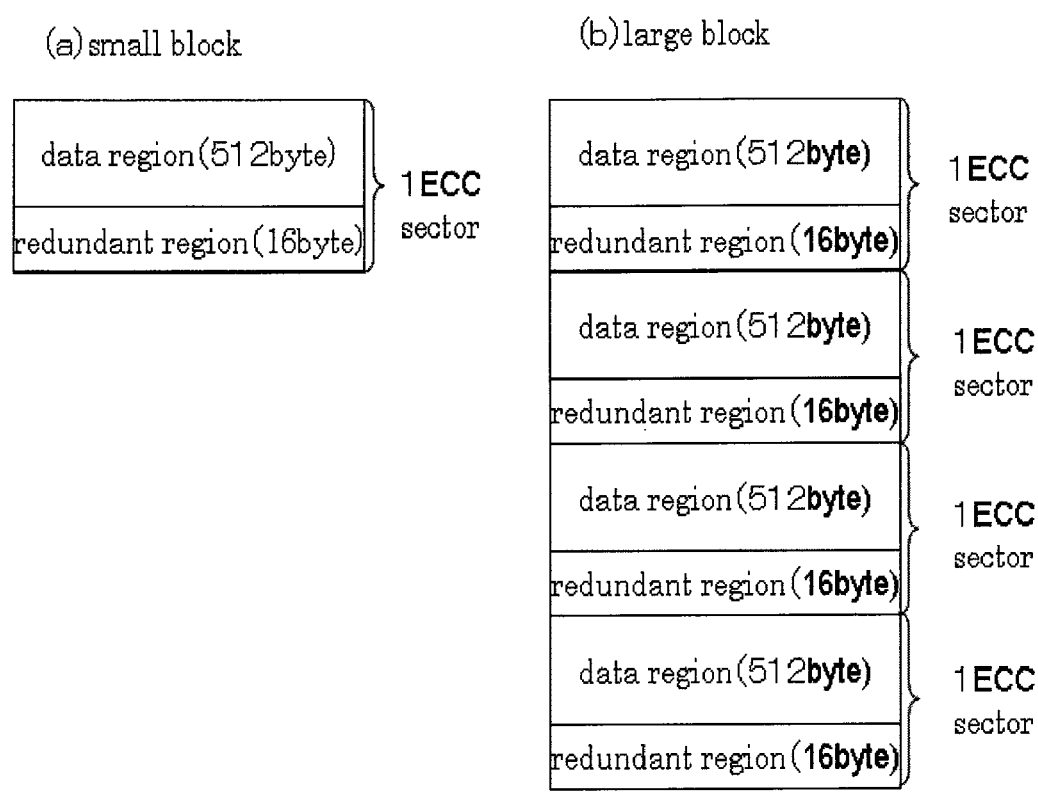
FIG. 10 is a diagram of an exemplary page structure of a NAND flash memory.

In the example of FIG. 13 10 data sectors are written to the physical segment address "0" so that the Host LBA is identified as "OAC3h" (h represents hexadecimal notation) and its status is recorded in virtual segment number "0".

In the case of "16 sectors applicability" (divided into 16 sectors), this number "16" coincides with the possible range of the value of the final digit of the host LBA. That is, the CPU 237 records the above mentioned data writing status, and the number of sectors being equal to 10; the data writing status and number of sectors being equal to 10 are recorded in virtual segment "0" starting from its sector address "3h" to "Ch" (see FIG. 13). This recording may be carried out by setting a flag (bit "1") at the pertinent sector address in the virtual segment. A part colored in gray in the virtual segment in FIG. 13 indicates such a flag was set.

In connection with this, the CPU commands the tag memory retrieving/updating circuit 33 to record an upper LBA and a group LBA related to the data written to the virtual segment number "0" in the tag table of the tag memory 31.

The upper LBA of the host LBA (OAC3h) is "OAC0h" in this case. That is to say, the upper LBA is the head position (sector address) of the virtual segment into which the data writing status is recorded. The upper LBA is uniquely determined by the host LBA.

If the virtual segment is composed of 32 sectors, the two least significant digits of upper LBA are 00h, 20h, 40h, 60h, 80h, A0h, C0h and E0h (eight in total).

If the host LBA is "3BD3h" for example, the $20^{th}$ sector address of the virtual segment in which the upper LBA is defined as "3BC0h" corresponds to the host LBA.

Meanwhile, the group LBA is determined by the number of sectors per one physical block of the flash memory. For example, because one physical block is composed of 256 sectors in if one physical block is composed of 64 pages and one page is composed of four sectors, the value of one physical block address can be expressed by the two least significant digits from "00h" to "FFh" of the host LBA. In other words, the value excluding the two least significant digits corresponds to the logical block number of the flash memory (wherein, the logical block corresponds to the physical block in the one-to-one relationship) This is exactly the group LBA in this embodiment. If the host LBA is "OAC3h" as described above, the two most significant digits of group LBA are "0A".

When the data write status is recorded in the virtual segment number "0", the CPU still records in the tag memory 31 that the data write status recorded in the virtual segment is "valid" (Valid value=1). When the system is turned ON, all virtual segments are initialized to "invalid" (Valid value=0).

The tag table also includes a "Lock" designation. Lock is used when the CPU 237 determines that it is to transfer the written data of a physical segment(s) to the NAND flash memory 21 and set a queue value for its corresponding virtual segments. That is, when the CPU 237 sets the queue value at the same time it sets Lock=1. When the CPU 237 sets Lock=1 to a certain virtual segment, the CPU 237 will not overwrite data to the physical segment corresponding to the virtual segment even if SSD 2 is commanded to write the data to the physical segment later. When the system is turned ON, all virtual segments are initialized to Lock=0.

CPU 237 also sets a LRU (Least Recently Used) No. "0" to the virtual segment number "0" and records it in the tag table of tag memory 31. LRU Nos. are sequential numbers, starting from "0," that the CPU 237 records as the data writing sequence to the physical segment in the virtual segment corresponding to the physical segment. Details of this action are described below.

When the data sent from the host 1 cannot be fully written to the physical segment address "0", that is, the amount of the data is larger than 16 sectors, the data are written to the next physical segment address "1". Then, the data writing status is recorded in the virtual segment number "1". The upper LBA of the virtual segment number "1" becomes "0AD0h" at this time. But the group LBAs on both the virtual segment number "0" and the virtual segment number "1" are set to "0A", i.e., the same LRU No. is set in both virtual segment numbers "0" and "1". Unless specifically otherwise stated, data write-commanded by host 1 can be written into one physical segment, as described in connection with the following embodiment.

Succeeding Data Writing

A-2

When the host 1 issues the next data-writing command to the SSD 2, the CPU 237 causes the tag memory retrieving/updating circuit 34 to retrieve tag memory 31. Then, when the tag memory retrieving/updating circuit 34 finds a virtual segment to which the same upper LBA that the data being write-commanded is set (retrieval result=hit), the data are overwritten to a physical segment correlated with the hit virtual segment. After that, CPU 237 updates the LRU No. of the overwritten virtual segments number to "0" and records "0" in the tag table of the tag memory 31. Then, when there is a virtual segment whose LRU No. is smaller than the previous LRU No. of the overwritten virtual segment, the CPU 237 adds the number one (1) to each LRU No. of those virtual segments and records the sum in the tag table of the tag memory 31.

A-3

When the tag memory retrieving/updating circuit 34 finds no virtual segment to which the same upper LBA as the upper LBA of the data being write-commanded is set (retrieval result=miss) and the tag memory retrieving/updating circuit 34 finds empty virtual segment(s), CPU 237 writes data to the empty physical segment and records the written data status in the virtual segment correlated with the physical segment.

Then, the CPU 237 records the upper LBA and group LBA of the data written to the empty physical segment in the tag table of the tag memory 31. The CPU 237 also sets the fact that the data written to the physical segment are "Valid" (value=1).

Then if there is no existing virtual segment whose group LBA is the same, CPU 237 sets the LRU No. "0" to a virtual segment of the physical segment to which the new data are written, and adds the number one (1) to the LRU No. of the other whole existing virtual segment(s), if any, and records the updated LRU No(s). in the tag memory.

To the contrary if there is an existing virtual segment whose group LBA is the same, CPU 237 sets the LRU No. that is supplied to the virtual segment into which the new data-writing-status is recorded, to a value equal to the value of the existing virtual segment having the same group LBA. Subsequently, CPU 237 changes the LRU No. to "0", and adds the number one (1) to the LRU No. that is set in the virtual segment(s) whose LRU No. is smaller than the previous LRU No. of the existing virtual segment and records the updated LRU No(s). in the tag memory 31.

The CPU 237 executes the above steps until the data written to the physical segment reaches a predetermined virtual segment (threshold value). This threshold value can be set so it is either part of the way to the final virtual segment or on the final virtual segment number.

The transition state described above is described in connection with FIGS. 14-16. FIG. 14 is a diagram of an exemplary state that follows the state of FIG. 13, and wherein the data writing to the physical segment was executed until the physical segment address "3" was reached. Consequently, the new data status was sequentially recorded in the virtual segment numbers "1", "2" and "3."

That is, this is a case when the data whose host LBA is 0511h and its data length of 5 sectors was written to the physical segment address "1", the data whose host LBA is 13B5h and its data length of 10 sectors was written to the physical segment address "2" and the data whose host LBA is 008Ah and its data length of 6 sectors was written to the physical segment address "3". The smallest value of LRU No. was set to the virtual segment that the oldest data was written to its corresponding physical segment, and larger values of LRU No. were set to the virtual segments to which the newer data were written.

FIG. 15 is a diagram of the state of the data whose host LBA is "0520h" and its data length is 13 sectors, wherein the data were written to the physical segment address "4" after the state shown in FIG. 14. Because the "group LBA" of the virtual segment number "1" and of the virtual segment number "4" are the same, (i.e., 5) the group LBA in virtual segment numbers 1 and 4 form the same LRU group. Accordingly, the CPU 237 sets the LRU No. of the virtual segment number "4" to "2" which is the LRU No. of the existing segment number "1"'s, and afterwards the CPU 237 updates the LRU Nos. of virtual segments "1" and "4" to "0" (see FIG. 15) and records the "0" updated LRU No. in the tag table of tag memory 31. Then, the CPU 237 (1) adds the number one (1) to the LRU No. of both the virtual segments numbered "2" and "3" because virtual segments "2" and "3" had LRU Nos. smaller than the previous LRU No. ("2") of virtual segment number "1", and (2) records the sums in the tag table of the tag memory 31. From FIG. 15, the LRU No. "1" of the virtual segment number "2" was updated to "2" and the LRU No. "0" of the virtual segment number "3" was updated to "1".

FIG. 16 is a diagram of an example of the state in which more data from physical segment addresses "5"-"15" were written and the status of these addresses is recorded in the corresponding virtual segment.

Process After Cache Memory Filled

When the CPU 237 executes data writing to the physical segment until the physical segment is filled, the CPU 237 (1) sets Lock=1 (the queue state) to the virtual segment whose LRU No. has the maximum value (all of the virtual segments if there are a plurality of virtual segments set to the same group LBA), and (2) records the maximum value in tag memory 31. Thereby, even if new data whose upper LBA is the same as existing data-written physical segment is derived by host 1, the new data are not overwritten into the existing physical segment. Thus, the data of the physical segment is protected.

Then, the CPU 237 (1) cancels all the LRU Nos. set in the virtual segment to the maximum LRU No., (2) sets a queue value "0" anew and (3) records the queue value "0" in the tag memory 31. The "Queue" means that the data written to the flash memory is in the state of queue. The CPU 237 commands the NAND flash controller 235 to write the data stored in the physical segment correlated with the virtual segment to the NAND flash memory 21; the data are written in turn starting from the smallest queue value, i.e. "0". Such writing is executed on the basis of pertinent information recorded in the tag memory 31 and the sector memory 32. This process will be described by referring to FIGS. 17-19.

FIG. 17 is a diagram of the state, after the state shown in FIG. 16, set in the tag table (i.e., memory) 31) at the time of a data purge from the physical segment which is the basis of the record of the virtual segment (the process of transferring data stored in the physical segment(s) towards the NAND flash memory is referred to in this document as "data purge" or simply "purge"). At the data purge, the CPU 237 (1) sets the Lock (set lock=1), thereby disabling overwrite to the virtual segment whose LRU No. is largest (the virtual segment number "5" and the virtual segment number "2"), (2) cancels both LRU Nos., and (3) sets a new queue value equal to "0".

Then, the CPU 237 searches physical block addresses of the NAND flash memory corresponding to the group LBA (logical block address) by referring to the "logical block—physical block conversion table" (see FIG. 20) and transfers, to the NAND flash controller 235, the data stored in each physical segment correlated with the virtual segment number "2" and the virtual segment number "5" whose queue value is set "0." The transfer is performed by CPU 237 specifying the physical block address. Then the NAND flash controller 235 writes the data to the NAND flash memory 21. While the basic procedure for data writing to the NAND flash memory 21 is carried out as described in the Background Art in this application, the method of FIGS. 13-19 is characterized by writing multiple write-commanded data from host 1 to one physical block of the NAND flash memory 21 all at once. This procedure is now described in detail.

At first, the CPU 237 commands the NAND flash controller 235 to write data transferred from the two physical segments to the specified physical block address of the NAND flash memory 21. Then, the NAND flash controller 235 copies the rewrite-needless data in a certain empty physical block of the NAND flash memory 21 in a unit described as a page in the "Background Art" portion of this document, and writes the transferred data to the block in page units. When writing of the data being transferred from the physical segments starts or ends during a transmission of a page, the NAND flash controller 235 (1) organizes the data so the data are in the form of one page by utilizing the buffer as described in the "Background Art" and (2) afterwards writes the organized data in the empty block. When the NAND flash controller 235 completes writing of data to the empty block, it (1) erases all the data in the physical segment to form an empty block, and (2) rewrites the logical block—physical block conversion table. As a result, the write time is shortened compared to the prior art described in the Background portion of this document, and there is a reduction in the number of data-rewrites into the NAND flash memory 21 compared to the prior art described in the Background portion of this document. The described method enables the rewriting operation to be usually performed only once, while the prior art normally requires more than one rewriting operation. Accordingly, it is possible to prolong the life of the flash memory.

FIG. 18 is a diagrammatic illustration of the state of the data being written into the physical segments correlated with the virtual segment number "2" and the virtual segment number "5," wherein the queue value "0" is set; the data illustrated in FIG. 18 as being transferred to NAND flash memory 21.

The data recorded in virtual segment number "2" and virtual segment number "5" are not erased at the time of the data transfer. However, because these data were already transferred towards the NAND flash memory 21, the CPU 237 derives and stores indicators in tag memory 31 that the data in the virtual number "2" and the virtual segment number "5" are invalid (Valid="0") (FIG. 19). The "invalid" values in virtual segment numbers "2" and "5" mean CPU 237 can handle the physical segment addresses "2" and "5" as empty physical segments. That is, Valid="0" (invalid) is set in virtual segment numbers "2" and "5", the CPU 237 considers the (1) setting of Lock=1 (overwrite is prohibited), (2) value of upper LBA, and (3) the value of group LBA of virtual segments "2" and "5" in the tag memory 31 to all be invalid. At the time when the data transfer towards NAND flash memory 21 is completed, the queue value set for the virtual segment is cancelled in the tag memory 31 (This is the stage in which both the queue value and the LRU No. are not set).

Now assume that a host LBA ("04D4h") is then specified and such a command is issued to write data into 5 sectors. As a result, CPU 237 makes tag memory retrieving/updating circuit 34 retrieve the tag memory 31 again. Then, the CPU 237 recognizes that (1) there are no virtual segments having the same upper LBA, and (2) both the virtual segment number "2" and the virtual segment number "5," from which the data purge was already executed, are empty segments (invalid (Valid Value="0")). This is a case of the write-commanded data occurring at this time being written to only one empty physical segment. In such a case, the CPU 237 can write the new data to the physical segment address "2" according to the previously determined rule, to write such new data beginning from the lowest empty physical segment address (FIG. 19). In this case (writing new data after a data purge), when the SSD 2 receives the write-command data from the host 1, the CPU 237 initially erases the data writing status concerning the virtual segment number "2" recorded in the sector map of the sector memory 32. Then, the ATA interface controlling section 231 responds to the command from the CPU 237 by sending to the host 1 a status signal indicating that the data transfer is satisfactory. Then, the host 1 transfers the data being saved in its buffer (not shown) to the SSD 2. The CPU 237 makes the SDRAM controller 234 store the data transferred from the ATA interface controlling section 231 in the physical segment which is the basis of the records of the virtual segment number "2", i.e. physical segment address "2" hereof.

When the data are stored in the physical segment address "2", the CPU 237 (1) changes the data of the physical segment address "2" to valid (valid="1"), (2) changes "Lock=1" to "Lock=0" ("lock=0" means "not the queue state"), (3) sets the LRU No. "0" to the virtual segment of the physical segment address "2", (3) changes the upper LBA to "04D0h," (4) sets the group LBA to "04," and (5) records all of these values in tag memory 31. Further, the CPU 237 adds the number one (1) to each LRU No. of data-valid-virtual-segments, causing the summed LRU Nos. to be recorded in the tag memory 31. FIG. 19 is a diagrammatic illustration of these results.

The Queue value(s) can be set as follows. For example, at the time when the data written to the cache memory 22 exceeds the number of the physical segment (threshold value), computer 237 (1) sets a queue value "0" in the virtual segment to which the largest LRU No. is set, and (2) purges data from a physical segment corresponding to the virtual segment to which the Queue value "0" is set. Then, computer 237 sets a new queue value "1" in a particular virtual segment at a time just before completion of the data transfer of Queue "0" towards the NAND flash memory 21. As a result of this method, (1) only one (1) queue of data can be transferred towards the NAND flash memory 21 at any one time, and (2) queue waiting for the data transfer is minimized (only one queue) by repeating this operation. In other words, it is possible to optimize the duty cycle of the data writing to the NAND flash memory 21.

If a multiple queue value is set, (1) another queue value is decreased respectively by one (1) every time the data transfer of queue "0" is completed, and (2) the CPU 237 can find the number of queues having data which are not completely transferred towards the NAND flash memory 21 by subtracting the number of queues from which data were purged from the number of the queue value set up.

That is, every time a queue value is set, the CPU 237 counts a pointer named "Host-Queue-Pointer." The data of the queue having the smallest value has priority in the sequential data-transferring procedure to the NAND flash memory 21, so every time this data-transfer is completed, the CPU 237 counts a pointer named "Disk-Queue-Pointer". Total Disk-Queue-Pointer corresponds to the number of Queues having data that were transferred towards the NAND flash memory 21, so that a value obtained by subtracting the value of the Disk-queue-Pointer from the value of the Host-Queue-Pointer equals the number of queues from which data has not been purged from the cache memory 22. The CPU 237 can utilize this value to control the data purge towards NAND flash memory 21.

Data sent from the host 1 to be written towards NAND flash memory 21 can cross two logical blocks of the NAND flash memory 21; in this case the data that is to be written crosses two physical segments and is suitably divided. For example, if data whose host LBA is "0AF0h" and its length is 32 sectors is to be written to cache memory 22, the group LBA of the first half of the data becomes "0A" and the group LBA of the second half becomes "0B".

While details of a preferred embodiment of the method and apparatus have been described above, some basic aspects of the method and apparatus are set forth.

1. During and after system turn ON, if the write command is issued by a host, the data are written sequentially from the first physical segment of a cache memory and its data writing status is recorded in the virtual segment correlated with the first physical segment.

2. When the physical segment data of the rewritten object block of the flash memory are the same, they are managed as the same LRU group.

3. If overwrite of data is allowable, such overwriting takes first priority.

4. If overwrite of data is not allowable, the data are stored in the next physical segment of the cache memory.

5. If the data are filled in the cache memory at the predetermined threshold, data purge is executed on the basis of a queue value(s) being set to the virtual segment whose LRU number is largest. This data-transfer towards the flash memory is carried out on the basis of information being recorded in both the tag memory and the sector memory.

6. If the empty physical segment of the cache memory is created by such a data purge, writing of new data to it is executed.

7. The above mentioned routine is executed until the data write command from the host ends and the whole cache memory data becomes empty (when the data write command from the host stops, the CPU automatically transfers the remaining data in the cache memory towards the NAND flash memory).

What is claimed is:

1. A data writing method of writing data which is write-commanded from a host into a NAND flash memory, the method comprising:

saving the data sent from the host once into a cache memory before written to the NAND flash memory, wherein the cache memory includes an aggregate of physical segments whose size is the product of one page sector size of the NAND flash memory and the m-th power of 2 (m is 0 or a positive integer), and causing a CPU of the host to record and manage, in a unit of a sector, the status of data being written to each physical segment, and the CPU executes a process, comprising steps of:

1) recording, in a virtual segment from its number "0", the writing status of data which initially are write-commanded from the host after turning a system ON and written to the physical segment of the cache memory; and a) recording upper LBA and group LBA of the written data into a tag memory by correlating a physical segment number with the virtual segment number;

b) recording, in the tag memory, that the written data to the physical segment is "valid", by the physical segment number correlating with the virtual segment number; and c) setting an LRU No. to the virtual segment and recording the setting status in the tag memory;

2) when a data write command is issued in succession from the host, searching the tag memory; and a) when there is an existing virtual segment having the same upper LBA as that of the write-commanded data, a-1) overwriting the write-commanded data to the physical segment being correlated with that existing virtual segment; and a-2) setting the LRU No. "0" to the existing virtual and adding the number one (1) to the LRU No. being set to the virtual segment(s), if any, whose LRU No. is smaller than the previous LRU No. of the existing virtual segment and recording the updated LRU No(s). into the tag memory;

b) when there is no virtual segment having the same upper LBA as that of the write-commanded data and there is an empty virtual segment, b-1) executing data writing to the empty physical segment; and b-2) when there is no virtual segment having the same group LBA, setting the LRU No. "0" to a virtual segment of the physical segment to which the new data are written, and adding the number one (1) to the LRU No. of the other whole existing virtual segment(s), if any, and recording the updated LRU No(s). in the tag memory;

b-3) when there is a virtual segment having the same group LBA, setting the LRU No. to the virtual segment in which the new data-writing-status is recorded, to the value of the existing virtual segment having the same group LBA, afterwards changing both of the LRU Nos. to "0", and adding the number one (1) to the LRU No. being set to virtual segment(s) whose LRU No. is smaller than the previous LRU No. of the existing virtual segment and recording the updated LRU No(s). in the tag memory; and executing the abovementioned steps until when data writing to the physical segment reaches a predetermined threshold value address.

2. The data writing method according to claim 1, wherein the CPU operates the following process, when the data writing to the physical segment is executed to the predetermined threshold value address, comprising steps of:

3-1) setting the virtual segment whose LRU No. is set to be the largest value to "Lock=1 (queue state)" and recording the "Lock=1" queue state in the tag memory;
3-2) canceling the LRU No. of all virtual segments in which the largest LRU No. is set, and in compensation for the canceling step, setting a queue value "0" anew and recording it in the tag memory;
3-3) transferring the data of the whole physical segment that is the basis of the records of the virtual segment whose queue value is set to "0" towards the side of the flash memory; and
3-4) setting, at the time just before completing the transfer of the data towards the flash memory, a new queue value "0" for the virtual segment whose LRU No. is largest and repeatedly executing it thereafter in the same manner.

3. A data storage apparatus comprising:
a NAND flash memory, a cache memory, and a host arranged to issue a write command for writing data into the NAND flash memory; the NAND flash memory, the cache memory and the cache memory being arranged for causing the data sent from the host to be saved in the cache memory before being written to the NAND flash memory,
wherein the cache memory includes an aggregate of physical segments whose size is the product of one page sector size of the NAND flash memory and the m-th power of 2 (m is 0 or a positive integer), and the host includes a CPU arranged to record and manage, in a unit of a sector, the status of data being written to each physical segment, and
the CPU is arranged to:
1) record, in a virtual segment from its number "0", the writing status of data which initially are write-commanded from the host after turning a system ON and written to the physical segment of the cache memory; and
  a) record upper LBA and group LBA of the written data into a tag memory by correlating a physical segment number with the virtual segment number;
  b) record, in the tag memory, that the written data to the physical segment are "valid", by correlating with the virtual segment number; and
  c) set an LRU No. to the virtual segment and record the set status in the tag memory;
2) search the tag memory when a data write command is issued in succession from the host; and
  a) when there is an existing virtual segment having the same upper LBA as that of the write-commanded data,
  a-1) overwrite the write-commanded data to the physical segment being correlated with that existing virtual segment; and
  a-2) set the LRU No. "0" to the existing virtual and adding the number one (1) to the LRU No. being set to the virtual segment(s), if any, whose LRU No. is smaller than the previous LRU No. of the existing virtual segment and record the updated LRU No(s). in the tag memory;
  b) when there is no virtual segment having the same upper LBA as that of the write-commanded data and there is an empty virtual segment,
  b-1) execute data writing to the empty physical segment; and
  b-2) when there is no virtual segment having the same group LBA, set the LRU No. "0" to a virtual segment of the physical segment to which the new data are written, and add the number one (1) to the LRU No. of the other whole existing virtual segment(s), if any, and record the updated LRU No(s). in the tag memory;
  b-3) when there is a virtual segment having the same group LBA, set the LRU No. to the virtual segment in which the new data-writing-status is recorded, to the value of the existing virtual segment having the same group LBA, afterwards change both of the LRU Nos. to "0", and add the number one (1) to the LRU No. being set to virtual segment(s) whose LRU No. is smaller than the previous LRU No. of the existing virtual segment and recording the updated LRU No(s). in the tag memory; and
execute the abovementioned steps until data writing to the physical segment reaches a predetermined threshold value address.

4. The apparatus according to claim 3, wherein
the CPU is arranged, when the data writing to the physical segment is executed to the predetermined threshold value address, to:
3-1) set the virtual segment whose LRU No. is set to be the largest value to "Lock=1 (queue state)" and record the "Lock=1" queue state in the tag memory;
3-2) cancel the LRU No. of all virtual segments in which the largest LRU No. is set, and compensate for the cancel operation, setting a queue value "0" anew and recording it in the tag memory;
3-3) transfer the data of the whole physical segment that is the basis of the records of the virtual segment whose queue value is set to "0" towards the flash memory; and
3-4) set, at the time just before completing the transfer of the data towards the flash memory, a new queue value "0" for the virtual segment whose LRU No. is largest and repeatedly executing it thereafter in the same manner.

5. A solid state disk for writing data to or reading data from a NAND type flash memory, comprising:
a cache memory comprising a plurality of physical segments having a data capacity of two to m-th power, m=0 or positive integer, of 1 (one) page of the NAND type flash memory, for temporarily holding data commanded by a host to be written to a NAND type flash memory,
a tag memory for recording an upper LBA, a group LBA and an LRU number, by a set, for every datum written to the physical segment, and
a processor for:
  a) executing data-writing to an empty physical segment in the cache memory if an identical upper LBA to the data to be written to the physical segment is not recorded in the tag memory and an empty physical segment exists in the cache memory, in response to the solid state disk receiving data from the host, and then
  b-1) if an existing group LBA identical to the data written in the step a) is not recorded in the tag memory, setting the LRU number of the data written in the step a) to "0" and increasing all existing LRU numbers by 1 (one) in the tag memory,
  b-2) if an existing group LBA identical to the data written in the step a) is recorded in the tag memory, setting the LRU number of the data written in the step a) to "0" and altering all existing LRU numbers of which group LBA is identical to the data written in the step a) to "0" in the tag memory, and increasing all existing LRU numbers less than the just formed LRU number that have been altered to "0" by 1 (one) in the tag memory.

6. The solid state disk of claim 5, wherein the processor is arranged for also repeatedly executing in this sequence the following steps:

c) canceling all maximum LRU numbers in the tag memory at a certain point in time, and
d) transferring from the physical segment to the NAND type flash memory all the data of the LRU numbers cancelled in the step c).

7. A data writing method for a NAND type flash memory in a solid state disk having 1) a cache memory including a plurality of physical segments having a data capacity of two to m-th power, m=0 or positive integer, of 1 (one) page of the NAND type flash memory, for temporarily holding data being commanded by a host so as to be written to a NAND type flash memory, and 2) a tag memory for recording an upper LBA, a group LBA and an LRU number, by a set, for every datum written to the physical segment, the method comprising the steps of:
 a) if an identical upper LBA to the data to be written to the physical segment is not recorded in the tag memory and an empty physical segment exists in the cache memory, when the solid state disk receives data from the host, executing data-writing to the empty segment, and then
 b-1) if an existing group LBA identical to the data written in the step a) is not recorded in the tag memory, setting the LRU number of the data written in the step a) to "0" and increasing all existing LRU numbers in the tag memory by 1 (one),
 b-2) if an existing group LBA identical to the data written in the step a) is recorded in the tag memory, setting the LRU number of the data written in the step a) to "0" and altering all existing LRU numbers of which group LBA is identical to the data written in the step a) to "0" in the tag memory, and, increasing by 1 (one) all existing LRU numbers less than the just former LRU number that have been altered to "0" in the tag memory.

8. The method of claim 7, further comprising repeatedly performing the following successive steps of
 c) canceling all maximum LRU numbers in the tag memory at a certain point in time, and
 d) transferring from the physical segment to the NAND type flash memory all the data of the LRU number cancelled in the step c).

* * * * *